United States Patent
Hsu et al.

(10) Patent No.: US 7,797,593 B2
(45) Date of Patent: Sep. 14, 2010

(54) METHOD AND APPARATUS FOR MEMORY AC TIMING MEASUREMENT

(75) Inventors: Chih-Chiang Hsu, Taipei County (TW); Shang-Chih Hsieh, Kaohsiung County (TW)

(73) Assignee: Faraday Technology Corp., Science-Based Industrial Park, Hsin-Chu (TW)

(*) Notice: Subject to any disclaimer, the term of this patent is extended or adjusted under 35 U.S.C. 154(b) by 385 days.

(21) Appl. No.: 11/958,710

(22) Filed: Dec. 18, 2007

(65) Prior Publication Data

US 2009/0158104 A1  Jun. 18, 2009

(51) Int. Cl.
  G11C 29/00 (2006.01)
  G06F 11/00 (2006.01)
  G06F 1/00 (2006.01)
  G04F 10/00 (2006.01)

(52) U.S. Cl. .................. 714/718; 714/815; 714/55; 702/176; 713/501

(58) Field of Classification Search ......... 714/718–719, 714/721, 745, 814, 815, 811, 42, 48, 54, 714/55; 365/194, 200, 201; 713/401, 400, 713/500, 501; 702/64, 65, 89, 118, 125, 702/142, 176, 182
See application file for complete search history.

(56) References Cited

U.S. PATENT DOCUMENTS

| 5,768,159 A | 6/1998 | Belkadi et al. |
| 6,479,983 B1 * | 11/2002 | Ebiya ..................... 324/158.1 |
| 7,007,215 B2 | 2/2006 | Kinoshita et al. |
| 7,286,950 B2 * | 10/2007 | Ozora et al. ................ 702/108 |
| 7,373,566 B2 * | 5/2008 | Mizuhashi et al. .......... 714/724 |

* cited by examiner

Primary Examiner—Christine T Tu
(74) Attorney, Agent, or Firm—Winston Hsu

(57) ABSTRACT

A timing measurement circuit inside a memory chip delays balanced test signals for generating delayed test signals. Each of the delayed test signals is input a corresponding input pin of a memory subsystem of the memory chip. By adjusting delay amount of the delayed test signals, AC timing parameters of the memory subsystem are tested and measured. When the timing measurement circuit is in ring oscillation, a resolution thereof is measured.

13 Claims, 4 Drawing Sheets

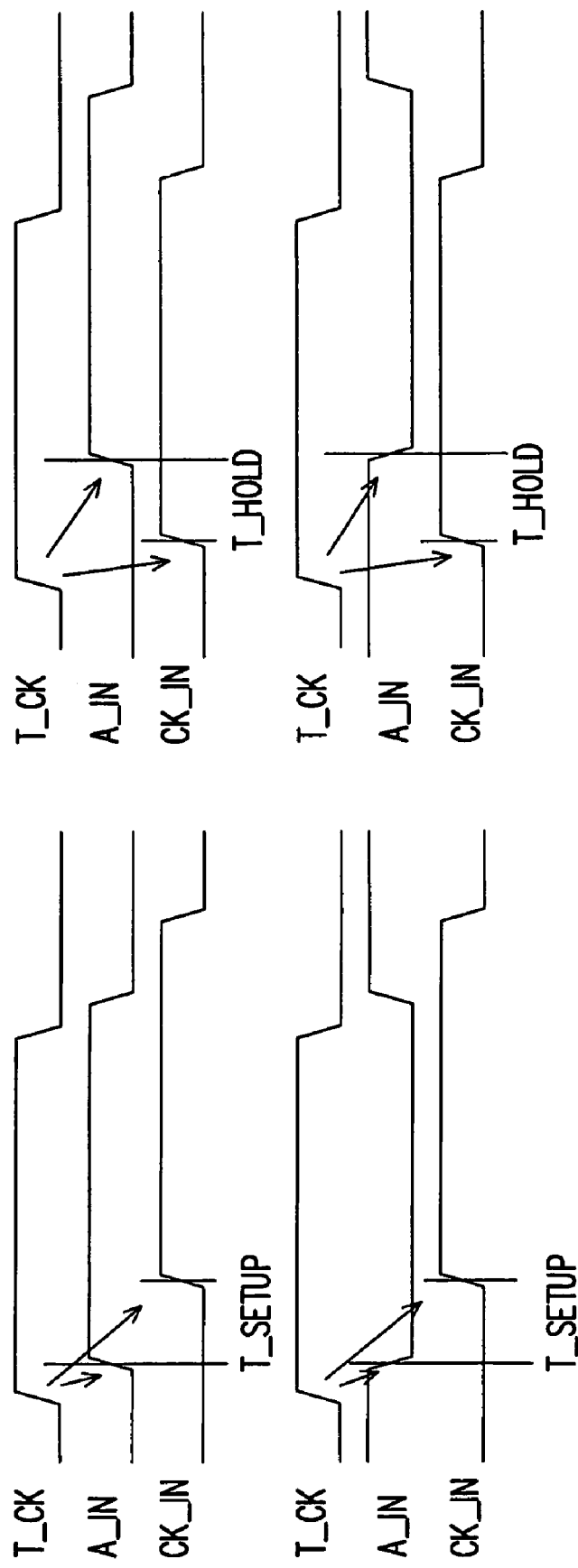

METHOD AND APPARATUS FOR MEMORY AC TIMING MEASUREMENT

BACKGROUND OF THE INVENTION

1. Field of the Invention

The present invention relates to a memory timing measurement circuit, a memory architecture, and a testing method thereof.

2. Description of Related Art

In memory test, how to correctly measure AC timing parameters is of great importance. Generally, AC timing parameters at least include a setup time parameter, a hold time parameter and an access time parameter.

In the past, tests of AC timing parameters are usually performed by an automatic testing machine (ATE). However, several disadvantages are caused.

(1) Due to high resolution, the ATE is not suitable for measuring the AC timing parameters of the memory. Generally, the resolution of the ATE can be up to 350 pico-seconds (ps); however, the AC timing parameters of memory may be merely several decades of ps. Thus, the accuracy of the measurement is easily reduced.

(2) Test signals sent by the ATE may have errors. When transmitted to a circuit board with a memory under test, the test signals pass routings and signal lines on the circuit, which causes greater errors (signal variations).

(3) It is difficult to know the true timing measurement value in the timing measurement. This is because the timing measurement value can merely be known from the ATE, and the signal timing inside the memory can merely be deduced from the measurement signal sent by the ATE.

(4) As the test signal, the control signal, and the clock signal are input from the outside of the memory, the number of the pins of the memory will be very large, which increases the chip area.

In order to overcome the above disadvantages, a memory timing measurement circuit, a memory architecture, and a testing method thereof are provided in the present invention.

SUMMARY OF THE INVENTION

The present invention is directed to provide a memory timing measurement circuit, a memory architecture, and a testing method thereof, which can provide timing measurement with high precision.

The present invention is further directed to provide a memory timing measurement circuit, a memory architecture, and a testing method thereof, which can reduce the number of output/input pins used in the timing measurement.

The present invention is further directed to provide a memory timing measurement circuit, a memory architecture, and a testing method thereof, which can improve the measuring efficiency.

The present invention is further directed to provide a memory timing measurement circuit, a memory architecture, and a testing method thereof, which can reduce the influence of the off-chip signal timing variation on the test results.

The present invention is further directed to provide a memory timing measurement circuit, a memory architecture, and a testing method thereof, which can easily complete the timing measurement.

The present invention is further directed to provide a memory timing measurement circuit, a memory architecture, and a testing method thereof, which can measure the measurement resolution of the memory timing measurement circuit.

An example of the present invention provides a memory chip, which includes a memory subsystem for storing data and including a plurality of pins; a clock tree for balanceably sending a test signal source; and a timing measurement circuit for receiving the test signal source sent by the clock tree, and individually delaying the test signal source to generate a plurality of delayed test signals for being sent to the pins of the memory subsystem, so as to test memory AC timing parameters of the memory subsystem by adjusting the timing of the delayed test signal sources.

Another example of the present invention provides a timing measurement circuit of a memory chip. The memory chip includes a memory subsystem and a clock tree for balanceably sending a test signal source. The timing measurement circuit includes: a plurality of timing measurement units (TMUs), in which each of the TMUs is coupled to one of a plurality of pins of the memory subsystem to measure memory parameters of the memory subsystem. Each of the TMUs includes: a switch having a control end for receiving an external switch control signal, a first end for receiving the test signal source sent by the clock tree, a second end for receiving an external data, a third end, and a fourth end; a plurality of series-connected delay circuits, in which an input end of a first-stage delay circuit is coupled to the fourth end of the switch, and a last stage of the delay circuits outputs a ring oscillator output signal indicating a resolution of the timing measurement circuit; and a multiplexer having a control end for receiving an external delay control signal, a plurality of input ends respectively coupled to a plurality of output ends of the delay circuits, and an output end coupled to the corresponding pin of the memory subsystem. The external switch control signal controls the operation mode of the TMU, and the external delay control signal controls a time difference between the test signal source and the output signal of the multiplexer.

Another example of the present invention provides a testing method the memory, which includes balanceably sending a test signal; respectively delaying the test signal to respectively generate a plurality of delayed test signals for being sent to a plurality of pins of the memory; and checking whether an output data output by the memory is correct and adjusting the timing of the delayed test signals input to the pins of the memory, so as to measure an AC timing parameter of the memory.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 4a and 4b are signal timing diagrams of internal test signals of the memory chip according to the present invention.

DESCRIPTION OF EMBODIMENTS

Figure 1:
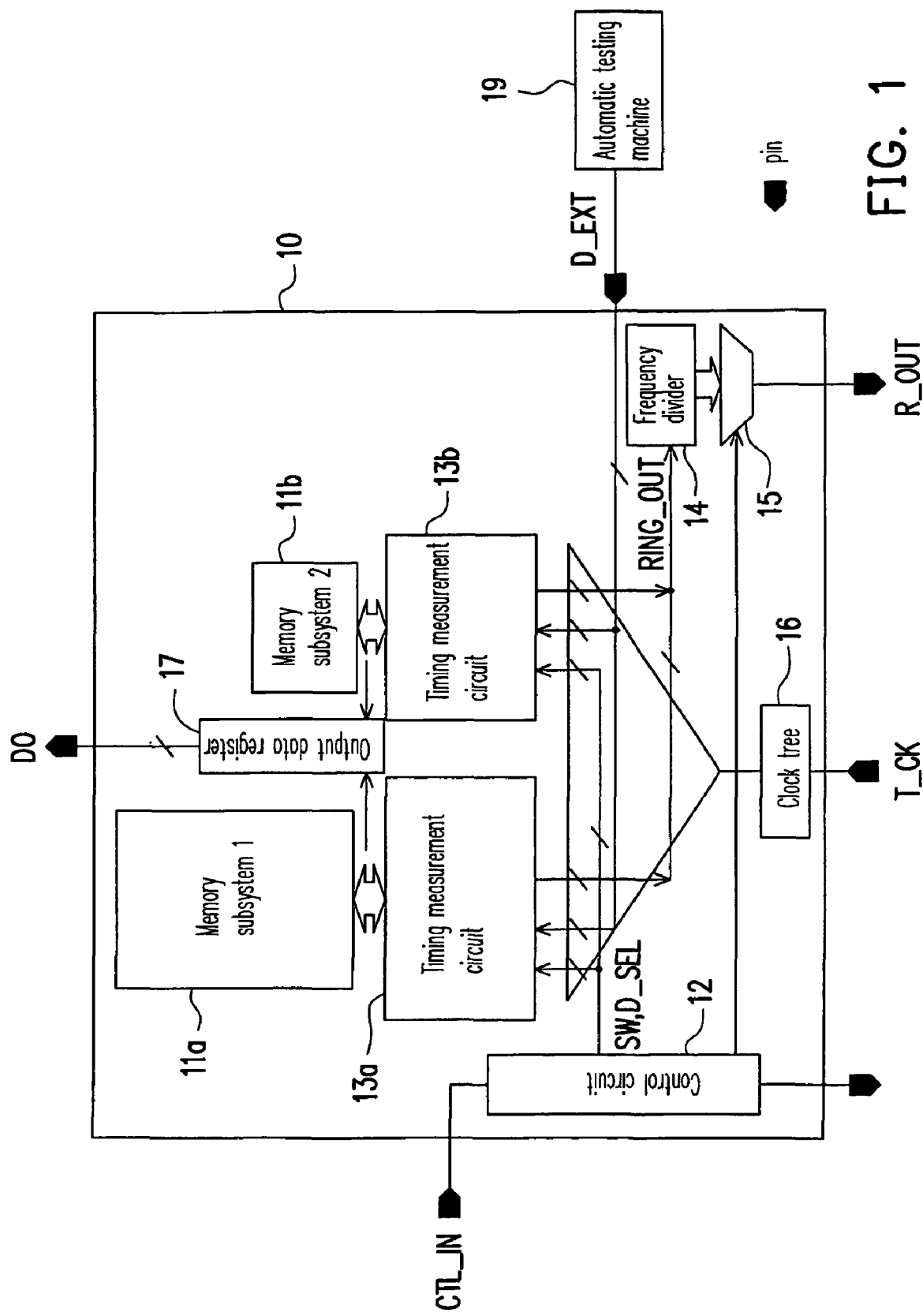
FIG. 1 is a block diagram of a memory chip having a memory timing measurement circuit according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

In embodiments of the invention, in order to reduce the variation of the off-chip test signals, all the test signals are generated by a clock tree. The clock tree receives a single clock signal, that is to say, the single clock signal can be considered as a root of the clock tree. The clock tree balanceably (synchronously) sends the test signals to each time measurement units TMUs to test AC timing parameters of the memory.

FIG. 1 is a block diagram of a memory chip having a memory timing measurement circuit according to an embodiment of the present invention. As shown in FIG. 1, a memory chip 10 includes memory subsystems 11a and 11b, a control circuit 12, timing measurement circuits 13a and 13b, a frequency divider 14, a multiplexer 15, a clock tree 16, and an output data register 17.

The memory subsystem stores data and is the object to be tested. It should be note that, though there are two memory subsystems 11a and 11b shown in FIG. 1, the number of the memory subsystem included in the memory chip according to embodiments of the present invention is not limited to this. Additionally, the memory capacities of the memory subsystems are not necessary to be the same to each other. The relationship between the numbers of the memory subsystem and timing measurement circuit is 1:1.

The control circuit 12 controls the timing measurement circuit and the multiplexer 15. When the memory chip 10 includes a plurality of timing measurement circuits, the control circuit 12 can send appropriate control signals (for example, a switch control signal SW and a control signal D_SEL) to individual timing measurement circuits.

In order to reduce the number of control signal pins of the memory chip 10, the control circuit 12 can include a shift register, which includes a plurality of sets of registers. One of the registers is used to register and output control signals required by a corresponding timing measurement circuit. The control signal is sent to the control circuit 12 in the memory chip 10 from outside through the control signal pins CTL_IN.

The timing measurement circuit measures the AC timing parameters of the memory subsystem. The detailed architecture and operation of the timing measurement circuit are illustrated with reference to FIGS. 2-4.

The frequency divider 14 divides the frequency of an output signal RING_OUT of the timing measurement circuit. When the frequency of the output signal RING_OUT is considerably high, the frequency of the output signals RING_OUT can be properly reduced by the frequency divider 14. In such a manner, no high-frequency and high-cost measuring circuits (not shown) are required to directly measure the frequency of the output signal RING_OUT. The period of the output signal RING_OUT can be used to count the resolution of the timing measurement circuit.

When the memory chip 10 includes a plurality of timing measurement circuits, the multiplexer 15 can select of which timing measurement circuit the output signal RING_OUT would be taken out. In FIG. 1, (a plurality of) input ends of the frequency divider are coupled to (a plurality of) output ends of (a plurality of) timing measurement circuits, and the output end of the frequency divider is coupled to the input end of the multiplexer. Those skilled in the art should know that, the coupling relationship between the multiplexer and the frequency divider is not limited to that shown in FIG. 1. For example, the coupling relationship of the multiplexer and the frequency divider can be changed, such that the multiplexer receives the output signals RING_OUT of (a plurality of) timing measurement circuits and selects one to output to the frequency divider, that is to say, the (plurality of) input ends of the multiplexer are coupled to the (plurality of) output ends of (the plurality of) timing measurement circuits, and the output end of the multiplexer is coupled to the input end of the frequency divider.

The clock tree 16 balanceably and synchronously sends a test signal source T_CK to the timing measurement circuit. The architecture of the clock tree 16 is not specially limited herein. For example, but not limited to, the clock tree 16 can include a plurality of buffers.

The output data register 17 stores the output data of the memory subsystem. By checking whether the output data is correct, whether the measured AC timing parameters is acceptable can be checked.

When the memory subsystem performs function test, an ATE 19 will send external function test signals D_EXT required by the memory subsystem to the timing measurement circuit. The external function test signals D_EXT include, for example, address signals, data input signals, write enable signals (WEB), output enable signals (OE), chip select signals (CSB) and clock signals CK, and so on.

Figure 2:
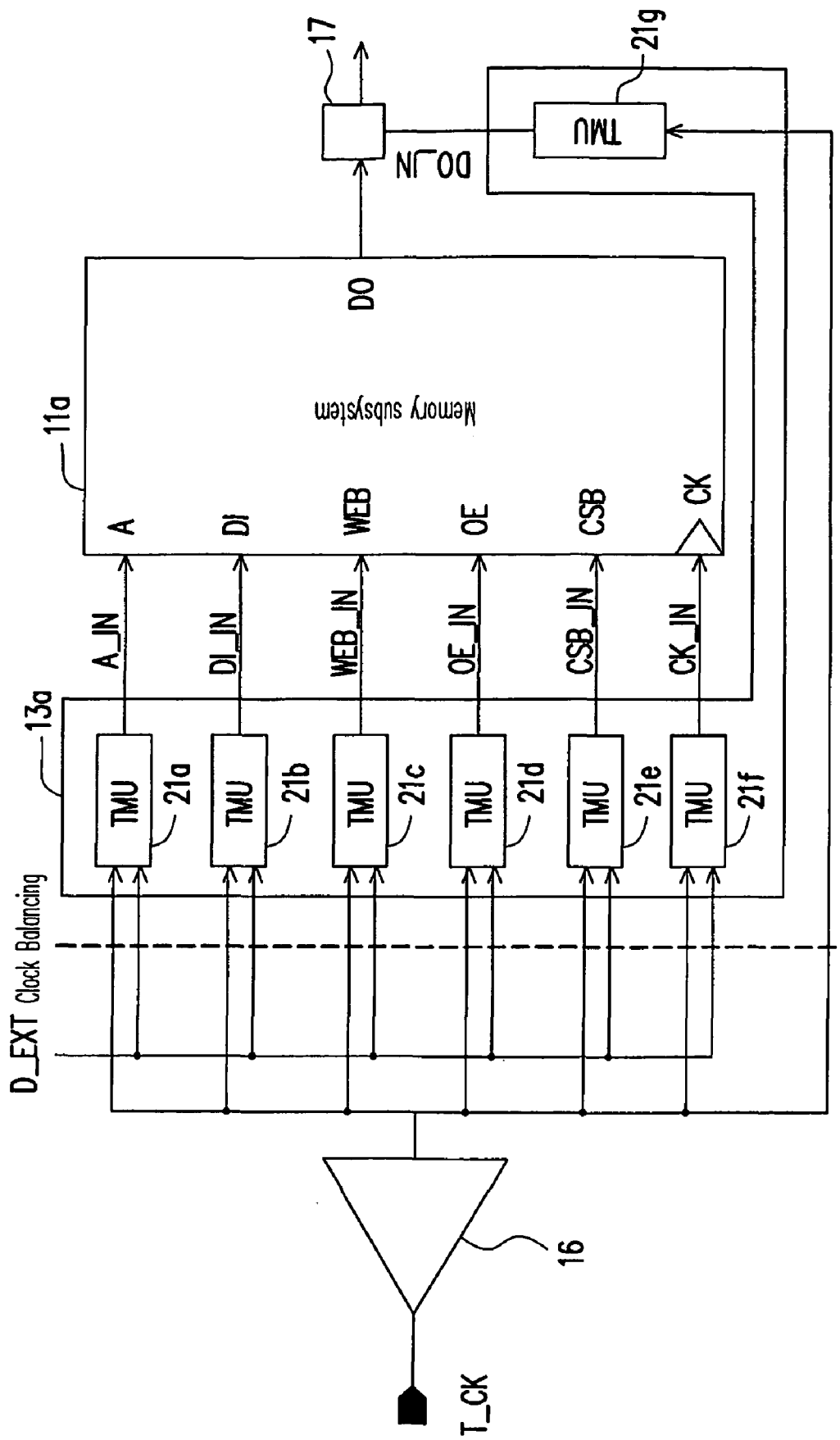
FIG. 2 is a schematic view of the memory timing measurement circuit according to the embodiment of the present invention.

FIG. 2 is a schematic view of the memory timing measurement circuit according to the embodiment of the present invention. Timing measurement circuits 13a and 13b have substantially similar or the same architectures. Now, referring to FIG. 2, the timing measurement circuit 13a includes a plurality of TMUs 21a-21g. For example, the memory subsystem includes an address signal input pin A, a data input pin DI, a write enable signal input pin WEB, an output enable signal input pin OE, a chip select signal input pin CSB, a clock signal input pin CK, and a data output pin DO, and the like.

Each of the TMUs is coupled to one of the input pins of the memory subsystem 11a. For example, the TMU 21a is coupled to the address signal input pin A. The TMU 21b is coupled to the data input pin DI. The TMU 21c is coupled to the write enable signal input pin WEB. The TMU 21d is coupled to the output enable signal input pin OE. The TMU 21e is coupled to the chip select signal input pin CSB. The TMU 21f is coupled to the clock signal input pin CK. The TMU 21g is coupled to the data output pin DO.

Each of the TMUs 21a-21g can perform different operation modes and apply different delay amounts on the test signal T_CK, under the control of control signals SW and D_SEL. As shown in FIG. 2, the TMU 21a delays the test signal T_CK into a signal A_IN to be input to the address signal input pin A. The TMU 21b delays the test signal T_CK into a signal DI_IN to be input to the data input pin DI. The TMU 21c delays the test signal T_CK into a signal WEB_IN to be input to the write enable signal input pin WEB. The TMU 21d delays the test signal T_CK into a signal OE_IN to be input to the output enable signal input pin OE. The TMU 21e delays the test signal T_CK into a signal CSB_IN to be input to the chip select signal input pin CSB. The TMU 21f delays the test signal T_CK into a signal CK_IN to be input to the clock signal input pin CK. The TMU 21g delays the test signal T_CK into a signal DO_IN to be input to the output data register 17. The TMU 21g and the output data register 17 can test the access time of the memory subsystem.

Figure 3:
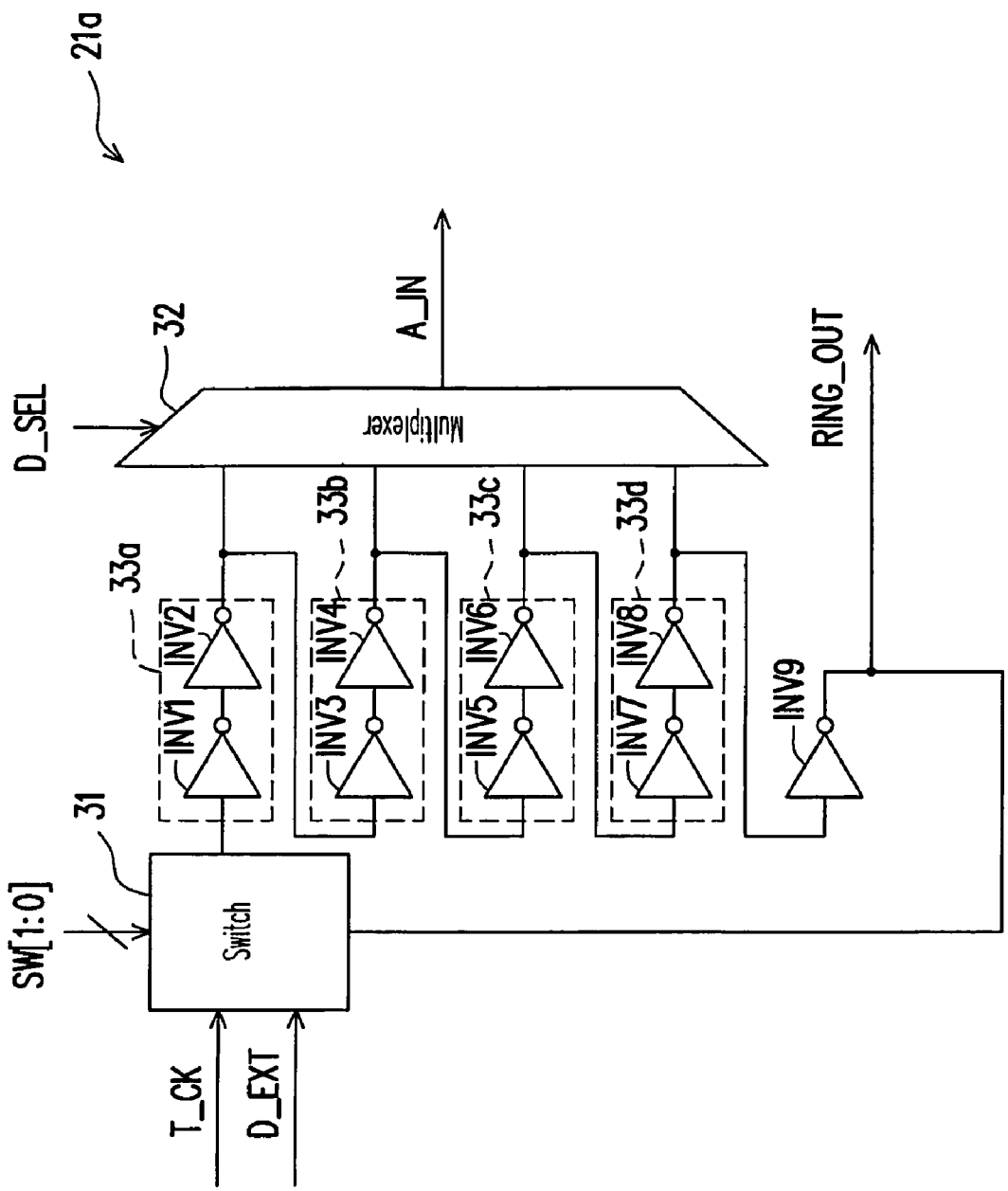
FIG. 3 is a schematic view of timing measurement units (TMUs) according to the embodiment of the present invention.

The operation modes and the delay operation of the TMUs can be known with reference to FIG. 3 and FIG. 4.

FIG. 3 is a schematic view of the TMUs according to the embodiment of the present invention. The TMUs 21a-21g have substantially similar or the same architectures. As shown in FIG. 3, the TMU 21a includes a switch 31, a plurality of series-connected inverter pairs, a buffer INV9, and a multiplexer 32. In FIG. 3, the embodiment of the present invention is illustrated by, but not limited to, 4 series-connected inverter pairs 33a-33d. The delay control signal D_SEL will determine the delay amount of the TMUs.

The switch 31 is controlled by the switch control signal SW [1:0]. According to the value of the switch control signal SW [1:0], the switch 31 has four operation modes. The four operation modes are listed in Table 1.

TABLE 1

| Mode | SW[1:0] | Input signal | | Output signal | |
|---|---|---|---|---|---|
| 1 | [0, 0] | T_CK | D_EXT | A_IN | x |
| 2 | [0, 1] | T_CK | D_EXT | A_IN | x |
| 3 | [1, 0] | T_CK | D_EXT | D_EXT | x |
| 4 | [1, 1] | T_CK | D_EXT | x | RING_OUT |

In table 1, "x" indicates don't care.

The operation mode 1 can also be referred to as a normal delay mode. In the operation mode 1, the switch control signal SW [1:0] is [0, 0]. Under this operation mode, the switch 31 guides the input signal (i.e., the test signal T_CK) to an input end of a first inverter pair 33a without inverting the input signal. The delay control signal D_SEL will determine the time difference between the output signal A_IN and the test signal T_CK.

The operation mode 2 can also be referred to as a reverse delay mode. In the operation mode 2, the switch control signal SW [1:0] is [0, 1]. Under this operation mode, the switch 31 will invert the input signal T_CK and then guide the input signal T_CK to the input end of the first inverter pair 33a. Similarly, the delay control signal D_SEL will determine the time difference between the output signal A_IN and the test signal T_CK.

The operation mode 3 can also be referred to as an external mode. In the operation mode 3, the switch control signal SW [1:0] is [1, 0]. Under this operation mode, the switch 31 will guide the external input signal D_EXT (provided by the ATE 19) to the input end of the first inverter pair 33a. That is to say, under this operation mode, the output signal A_IN can be considered as the delayed address signal. The delay control signal D_SEL will determine the time difference between the output signal A_IN and the external input signal D_EXT.

The operation mode 4 can also be referred to as a ring oscillator mode. In the operation mode 4, the switch control signal SW [1:0] is [1, 1]. Under this operation mode, the switch 31 will make the inverter pairs 33a-33d and the buffer INV9 become a ring oscillator. That is to say, the switch 31 will couple the output end of the buffer INV9 to the input end of the inverter pair 33a.

Each of the inverter pairs includes a plurality of series-connected inverters. For example, the inverter pair 33a includes series-connected inverters INV1 and INV2. The inverter pair 33b includes series-connected inverters INV3 and INV4. The inverter pair 33c includes series-connected inverters INV5 and INV6. The inverter pair 33d includes series-connected inverters INV7 and INV8. The output end of each inverter pair is coupled to one of the input ends of the multiplexer 32 and the input end of the next-stage inverter pair. Each of the inverter pairs can server as a delay circuit to delay the signal.

The buffer INV9 can improve the drive capability of the output signal of the last-stage inverter pair. The signal RING_OUT is output by the buffer INV9.

The multiplexer 32 determines of which inverter pair the output signal can be selected as the signal A_IN according to the delay control signal D_SEL. For example, when the multiplexer 32 selects the output signal inverter pair 33a as the signal A_IN, it indicates that the time difference between the signal A_IN and the signal T_CK is two basic delay times, in which one basic delay time is provided by one inverter. Further, in this specification, one basic delay time can also be referred to as the resolution of this timing measurement circuit.

Assume that the frequency divider is a frequency divider divided by N (N is a positive integer). When the TMUs are in the operation mode 4 (ring oscillator mode), one period of the signal RING_OUT is equal to twice of the resolution. The resolution of the timing measurement circuit can be expressed as $(\frac{1}{2})*(1/N)*(1/R\_OUT)$. R_OUT indicates the frequency of the output signal R_OUT of the frequency divider.

FIGS. 4a and 4b are signal timing diagrams of internal test signals inside the memory chip according to the embodiment of the present invention. For the sake of simplification, FIGS. 4a and 4b merely show the timing diagrams of the test signals A_IN and CK_IN applied to the address pin A and the clock pin CK of the memory subsystem.

FIG. 4a is the timing diagram of the test signals A_IN and CK_IN for measuring the setup time T_SETUP. As shown in FIG. 4a, in order to ensure the correct operation of the memory subsystem, after transiting the test signal A_IN, at least after the setup time T_SETUP, the test signal CK_IN can have transition. That is to say, the signal A_IN leads the signal CK_IN. In this embodiment, when the output data DO of the memory subsystem is still correct, the minimal setup time T_SETUP can be obtained by adjusting the amount of the delay time of the TMU 21a or 21f.

FIG. 4b is the timing diagram of the test signals A_IN and CK_IN for measuring the hold time T_HOLD. As shown in FIG. 4b, in order to ensure the correct operation of the memory subsystem, after transition of the test signal CK_IN, at least after the hold time T_HOLD, the test signal A_IN can have transition. That is to say, the signal A_IN lags behind the signal CK_IN. In this embodiment, when the output data DO of the memory subsystem is still correct, the minimal hold time T_HOLD can be obtained by adjusting the amount of the delay time of the TMU 21a or 21f.

In conventional art, test signals are generated by an external ATE and sent to a memory chip under test. Therefore, if the external test signals have timing variations or errors, the accuracy of the test will be influenced. In this embodiment, the test signals are generated inside the memory chip, so the accuracy of the test can be improved, as well as the efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory chip, comprising:
   a memory subsystem, storing data, and comprising a plurality of pins;
   a clock tree, balanceably sending a test signal source; and
   a timing measurement circuit, receiving the test signal source sent out by the clock tree and delaying the test signal source individually according to a plurality of external control signals received by the memory chip to generate a plurality of delayed test signals, and sending the delayed test signals to the pins of the memory subsystem, so as to test memory AC timing parameters of the memory subsystem.

2. The memory chip as claimed in claim 1, further comprising:
 a control circuit, controlling an operation mode of the timing measurement circuit and a delay amount of the delayed test signals according to the external control signals.

3. The memory chip as claimed in claim 1, wherein the timing measurement circuit outputs a ring oscillator output signal when the timing measurement circuit is in a ring oscillator mode and the memory chip further comprises:
 a frequency divider, receiving and dividing the ring oscillator output signal, wherein the divided ring oscillator output signal expresses a delay resolution of the timing measurement circuit.

4. The memory chip as claimed in claim 3, wherein the memory chip comprises a plurality of timing measurement circuits, wherein each of the timing measurement circuits receives the test signal source sent out by the clock tree and delaying the test signal source individually according to a plurality of the external control signals to generate a plurality of delayed test signals, and sends the delayed test signals to the pins of the memory subsystem, wherein each of the timing measurement circuit outputs a ring oscillator output signal when the timing measure circuit is in a ring oscillator mode, a plurality of ring oscillator output signals of the timing measurement circuits is input to the frequency divider, and the memory chip further comprises:
 a multiplexer, coupled to the frequency divider, selecting one of the divided ring oscillator output signals output by the frequency divider as an output of the multiplexer.

5. The memory chip as claimed in claim 1, further comprising:
 an output data register, receiving an output data of the memory subsystem.

6. The memory chip as claimed in claim 1, wherein the timing measurement circuit comprises a plurality of timing measurement units (TMUs), each of the TMUs is coupled to a corresponding one of the pins of the memory subsystem, each of the TMUs delays the test signal source according to one of the external control signals to generate one of the delayed test signals and sends the one of the delayed test signals to the corresponding pin of the memory subsystem.

7. The memory chip as claimed in claim 6, wherein each TMU comprises:
 a switch, wherein an operation mode thereof is determined according to a switch control signal;
 a plurality of series-connected delay circuits, wherein an input end of each of the delay circuits is coupled to an output end of the switch or an output end of a previous-stage delay circuit, a final stage of the delay circuits outputs the ring oscillator output signal; and
 a multiplexer, receiving a plurality of outputs of the delay circuits and selecting one of the outputs according to one of the external control signals to be the delayed test signal sent to the corresponding pin of the memory subsystem.

8. A timing measurement circuit of a memory chip, wherein the memory chip comprises a memory subsystem and a clock tree balanceably sending a test signal source, the timing measurement circuit comprises:
 a plurality of timing measurement units (TMUs), wherein each of the TMUs is coupled to a corresponding one of a plurality of pins of the memory subsystem for measuring memory parameters of the memory subsystem, each TMU comprising:
 a switch, having a control end receiving an external switch control signal, a first end receiving the test signal source sent by the clock tree, a second end receiving an external data, a third end, and a fourth end;
 a plurality of series-connected delay circuits, wherein an input end of a first stage delay circuit of the delay circuits is coupled to the fourth end of the switch, a last stage of the delay circuits outputs a ring oscillator output signal, and the ring oscillator output signal indicates a resolution of the timing measurement circuit; and
 a multiplexer, having a control end receiving an external delay control signal, a plurality of input ends respectively coupled to a plurality of output ends of the delay circuits, and an output end coupled to the corresponding pin of the memory subsystem;
 wherein the external switch control signal controls the operation mode of the TMU, and the external delay control signal controls a time difference between the test signal source and the output signal of the multiplexer.

9. A testing method of a memory, comprising:
 balanceably sending a test signal;
 respectively delaying the test signal to respectively generate a plurality of delayed test signals and sending the delayed test signals to a plurality of pins of the memory; and
 measuring an AC timing parameter of the memory by adjusting delay time of a first one and a second one of the delayed test signals and checking whether an output data output by the memory is correct.

10. The method as claimed in claim 9, further comprising:
 in response to an external control signal, a timing measurement circuit in the memory sending an external test data to the memory to perform a function test.

11. The method as claimed in claim 10, further comprising:
 in response to the external control signal, making a timing measurement unit (TMU) of the timing measurement circuit perform a ring oscillation function to measure a delay resolution.

12. The method as claimed in claim 9, wherein the AC timing parameter is a setup time parameter, the first one of the delayed test signals is sent to an address pin of the memory, the second one of the delayed test signals is sent to a clock pin of the memory, and the method further comprises:
 measuring the setup time parameter by adjusting the delay time of the first one and the second one of the delayed test signals so that a transition of the first one of the delayed test signals leads a transition of the second one of the delayed test signals and finding a minimal difference between the delay time of the first one and the second one of the delayed test signals that can maintain the correct output data.

13. The method as claimed in claim 9, wherein the AC timing parameter is a hold time parameter, the first one of the delayed test signals is sent to an address pin of the memory, the second one of the delayed test signals is sent to a clock pin of the memory, and the method further comprises:
 measuring the hold time parameter by adjusting the delay time of the first one and the second one of the delayed test signals so that a transition of the first one of the delayed test signals lags behind a transition of the second one of the delayed test signals and finding a minimal difference between the delay time of the first one and the second one of the delayed test signals that can maintain the correct output data.

* * * * *